United States Patent [19]
Zuk

[11] 3,828,206
[45] Aug. 6, 1974

[54] HIGH SPEED DRIVING CIRCUIT FOR PRODUCING TWO IN-PHASE AND TWO OUT-OF-PHASE SIGNALS

[75] Inventor: Borys Zuk, New Brunswick, N.J.

[73] Assignee: RCA Corporation, New York, N.Y.

[22] Filed: Mar. 12, 1973

[21] Appl. No.: 340,297

[30] Foreign Application Priority Data

Mar. 15, 1972 Great Britain .................... 11970/72

[52] U.S. Cl. ................. 307/254, 307/247, 307/270, 307/280

[51] Int. Cl. ............................................ H03k 17/66

[58] Field of Search ........... 307/247, 250, 254, 255, 307/321, 270, 280

[56] References Cited

UNITED STATES PATENTS

| | | | |
|---|---|---|---|
| 2,821,639 | 1/1958 | Bright et al. | 307/254 |
| 3,078,379 | 2/1963 | Plogstedt et al. | 307/254 |
| 3,191,121 | 6/1965 | Nelson | 307/254 |
| 3,263,091 | 7/1966 | Cole et al. | 307/254 |
| 3,525,883 | 8/1970 | Iurdanidis | 307/254 |

*Primary Examiner*—John S. Heyman
*Attorney, Agent, or Firm*—H. Christoffersen; Henry I. Schanzer

[57] ABSTRACT

The circuit includes four transistors, each transistor being connected at its emitter to a different one of four switches arranged in a bridge configuration. The four transistors are paired, each pair including a first transistor connected at its emitter to the collector of the second transistor. The conduction of the first transistor of one pair and of the second transistor of the other pair is controlled by the same signal and the conduction of the second transistor of said one pair and the first transistor of the other pair is controlled by the complement of said signal. The two transistors of each pair produce complementary signals at their emitters and conduct current for all signal conditions.

14 Claims, 2 Drawing Figures

HIGH SPEED DRIVING CIRCUIT FOR PRODUCING TWO IN-PHASE AND TWO OUT-OF-PHASE SIGNALS

This invention relates to a circuit arrangement which, in response to a signal and its complement, produces two signals which are in phase with the input signal and two signals which are out-of-phase.

Circuit arrangements are known which in response to an input signal and its complement produce four output signals, two of which are in phase with the input signal and two of which are out-of-phase with the input signal. The two out-of-phase signals being generally in phase with the complement of the input signal. One of the many uses for such a circuit arrangement is a driver for a bridge circuit in which there is an active device, operating as a switch, in each of the arms of the bridge. The driver operates in response to the input signals to control the condition of the switches in the bridge circuit and thereby control the current flow through the load connected across the arms of the bridge. Delays in turning on or turning off switches may result in one switch turning on before another switch turns off, with the result that there is insufficient net current flowing in the desired direction through the load, high power dissipation and erroneous output signal. This condition is aggravated when the circuitry which drives the switches includes active devices which are operated between cut-off and saturation.

It is a feature of the present invention that the active devices which produce the aforementioned four output signals always operate in the active region, i.e., none of the active devices operates in cut-off or saturation, whereby the circuit can produce rapid changes in the output signals in response to a change in the input signals.

Circuits embodying the invention include first and fourth means responsive to a first input signal for producing signals which are in-phase with said input signal at first and fourth output terminals, respectively, and second and third means responsive to an input signal which is the complement of said first signal for producing signals which are out-of-phase with said input signal at second and third output terminals, respectively. The fourth means includes a conduction path coupled between said second means and said fourth output terminal and the third means includes a conduction path coupled between said first means and said third output terminal said third and fourth means conducting their currents via said first and second means, respectively, whereby, regardless of the input signal condition, conduction is maintained in all of said means.

Figure 1:
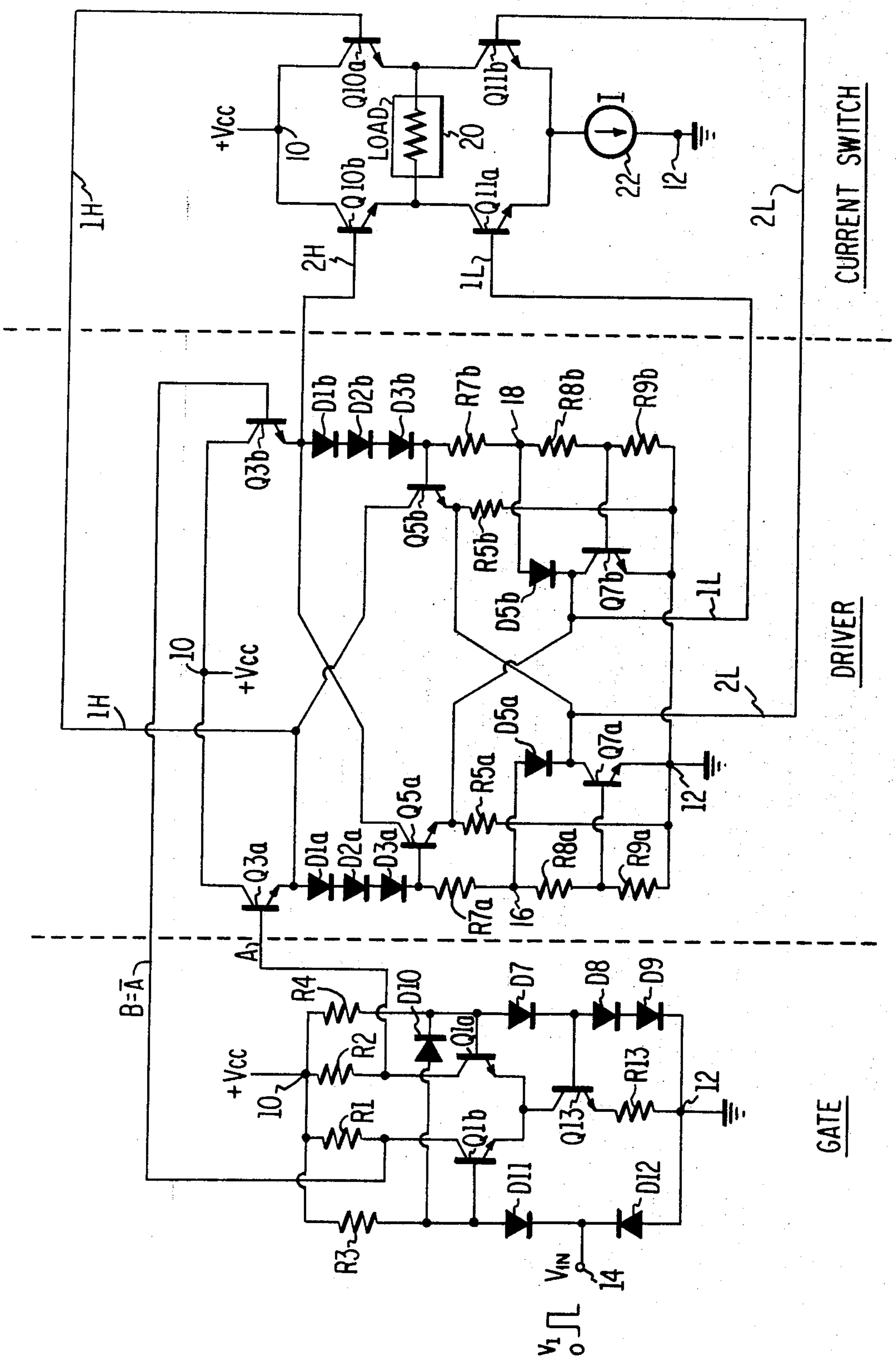
Figure 2:
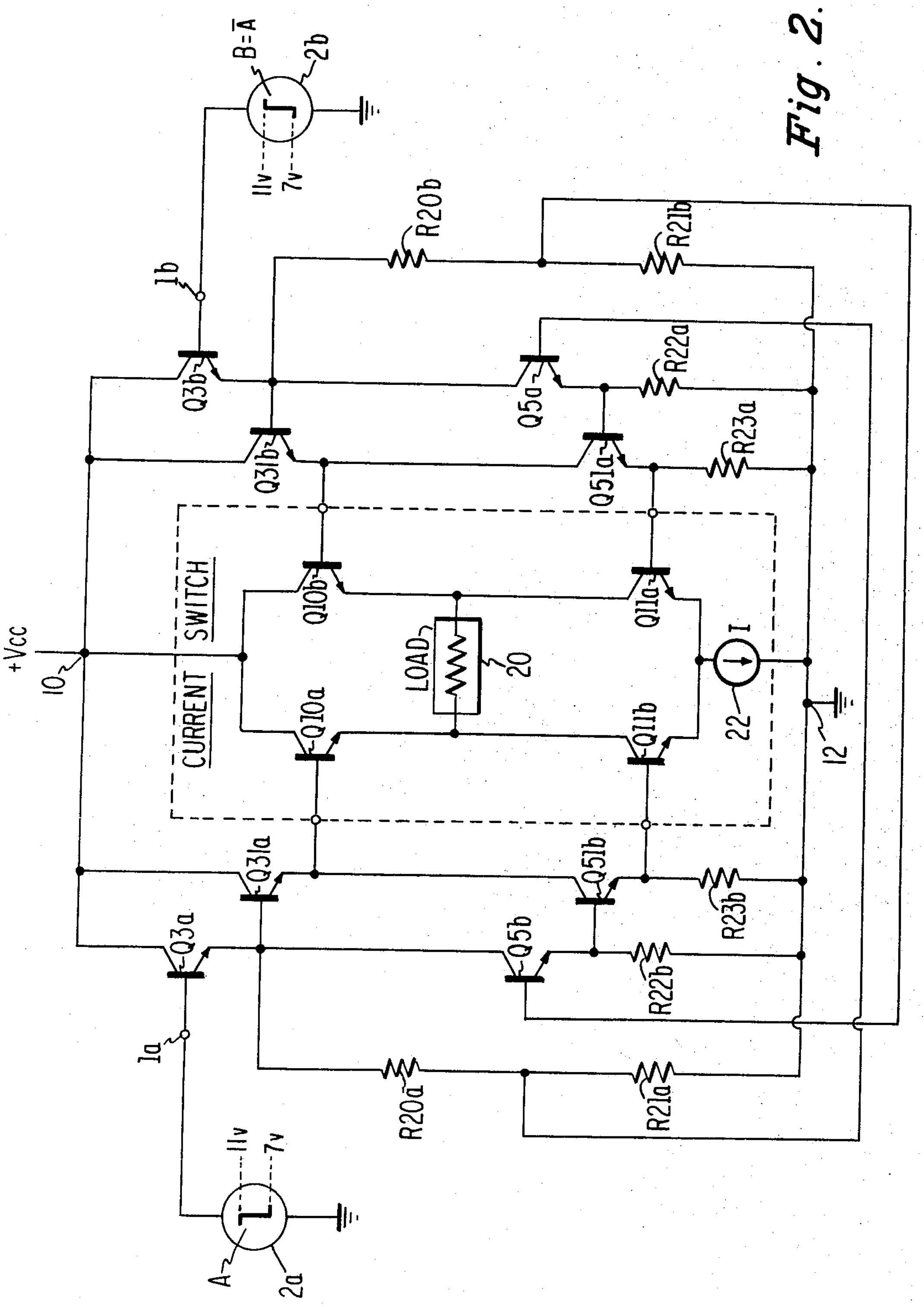

In the accompanying drawings like reference numerals denote like components; and FIG. 1 is a schematic diagram of a circuit embodying the invention; and FIG. 2 is a schematic diagram of another circuit embodying the invention.

The circuit of FIG. 1 includes a gate section, a driver section and a current switch section.

The gate section includes a differential amplifier comprising transistors Q1*a* and Q1*b* which are connected at their emitters to the collector of current source transistor Q13. Transistor Q1*b* is connected at its base to the anode of diode D11 and to one end of resistor R3. The cathode of diode D11 is connected to input terminal 14, and the other end of resistor R3 is connected to power terminal 10. A source of positive potential, $+V_{cc}$, is connected to terminal 10 and ground potential (zero volts) is applied to terminal 12. Diode D12 connected between input terminal 14 and terminal 12 prevents the potential at terminal 14 from going negative by more than one $V_{BE}$ drop. Resistor R4 is connected in series with diodes D7, D8, and D9 between terminals 10 and 12. This series string is used to develop and set the base potential of transistors Q1*a* and Q13. The potential at the base of transistors Q1*a* and Q13 will be at 3 $V_{BE}$ drops and 2 $V_{BE}$ drops above ground, respectively. The collectors of transistors Q1*b* and Q1*a* are coupled to terminal 10 by means of resistors R1 and R2, respectively. At the collector of transistor Q1*b* there is produced an output signal, $\bar{B} = A$, which is out of phase with the input signal, $V_{IN}$, while at the collector of transistor Q1*a* there is produced an output signal, *A*, which is in phase with $V_{IN}$.

A diode D10 is connected between the bases of transistors Q1*b* and Q1*a* with its anode connected to the base of transistor Q1*b* and its cathode connected to the base of transistor Q1*a*. Diode D10 prevents transistor Q1*b* from going into deep saturation when the input signal goes highly positive. Diode D10 clamps the base of transistor Q1*b* to one $V_{BE}$ drop above the potential at the base of transistor Q1*a*. Keeping transistor Q1*b* out of saturation is important to maintain the speed of the input circuit.

When $V_{IN}$ goes from zero volts to a potential $V_1$, which may be on the order of 2 to 3 volts, the potential at the collector of transistor Q1*b* goes in a negative direction by 3 or 4 volts and the potential at Q1*a* goes in a positive direction by a corresponding amount. Thus, the gate section in response to a single ended input signal, $V_{IN}$, applied to input terminal 14, produces double ended output signals (*A* & *B*) which are applied to the bases of transistors Q3*a* and Q3*b*, respectively. Where $+V_{cc}$ is, for example, 11 volts the *A* and *B* output signals may vary between 11 volts (arbitrarily defined as the logic "1" or "high" level) and 7 volts (arbitrarily defined as the logic "0" or "low" level).

The driver circuit is comprised of two similar and symmetrical portions. One portion is responsive to the A signal and its components are labelled with an *a* subscript. The other portion is responsive to the *B* signal ($\bar{A}$) and its components are labelled with a *b* subscript.

The *a* portion of the driver includes transistor Q3*a* connected at its collector to terminal 10, at its base to the collector of transistor Q1*a*, and at its emitter to: 1) the base of transistor Q10*a;* 2) the collector of transistor Q5*B;* and 3) one end of a level shift and biasing network. The level shift circuit includes three diodes (D1*a*, D2*a*, D3*a*) connected in series between the emitter and base of transistors Q3*a* and Q5*a*, respectively. Transistor Q5*a* is connected at its collector to the emitter of transistor Q3*b* and the base of transistor Q10*b*, and at its emitter to: 1) the base of transistor Q11*a;* 2) the collector of transistor Q7*b;* and 3) one end of emitter resistor R5*a*. The other end of resistor R5*a* is connected to terminal 12. The anode of diode D5*a* is connected to the junction of resistors R7*a* and R8*a*, and the base of transistor Q7*a* is connected to the junction of resistors R8*a* and R9*a*. Transistor Q7*a* is connected at its collector to the cathode of diode 5*a*, to the emitter of transistor Q5*b* and the base of transistor Q11*b*, and is connected at its emitter to terminal 12.

Due to the symmetry of the circuit, the description of the *b* portion of the driver circuit is identical to the description of portion *a*, above, if the *a* and *b* subscripts are interchanged. The description of portion *b* is, therefore not detailed.

The current switch section comprises transistors Q10*a*, Q10*b*, Q11*a*, and Q11*b*, a load 20, and a current source 22. Transistors Q10*a* and Q10*b* are connected at their collectors to terminal 10 and at their emitters to the collectors of transistors Q11*a* and Q11*b*, respectively. The current source 22, which may conduct currents in the order of 1 ampere, is connected between the emitters of transistors Q11*a* and Q11*b* and terminal 12. The load 20, which may, for example, have a very low dc impedance (e.g. 1–2 ohms) is connected between the emitters of transistors Q10*a* and Q10*b*. The load 20 may be, for example, a read/write head for use in a magnetic disc or magnetic tape memory.

In the operation of the circuit, transistors Q10*a* and Q11*a* are paired and transistors Q10*b* and Q11*b* are paired. For one condition of input signal transistors Q10*a* and Q11*a* are energized (transistors Q10*b* and Q11*b* are turned off) and current flows from terminal 10 through the collector-to-emitter path of transistors Q10*a*, through the load and through the collector-to-emitter path of transistor Q11*a* into current source 22. For the other condition of input signals transistors Q10*b* and Q11*b* are turned on (transistors Q10*a* and Q11*a* are turned off) and current flows in the opposite direction through the load. That is, current flows from terminal 10 through the collector-to-emitter path of transistor Q10*b* through the load and through the collector-to-emitter path of transistor Q11*b* into current source 22.

Due to the symmetry of the driver and switch circuitry, the operation of the circuit may be generally described by defining subscript *i* as one of *a* or *b* and subscript *j* as the other one of *a* or *b*.

The voltage at the emitter of transistor Q3*i* is applied: 1) directly to the base of transistor Q10*i;* 2) with a 3 $V_{BE}$ drop (through level shift diodes D1*i*, D2*i* and D3*i*) to the base of transistor Q5*i;* and 3) with a further drop through resistors R7*i* and R8*i* to the base of transistor Q7*i*. The voltage at the emitter of transistor Q5*i* is applied directly to the base of transistor Q11*i* and is $V_{BE}$ volts below that at the emitter of transistor Q3*i*. The emitter voltages of transistors Q3*i* and Q5*i* are thus in phase and are one diode drop and five diode drops, respectively, below the signal level applied to the base of transistor Q3*i*. When the input signal to transistor Q3*i* goes high or low the voltage levels at the bases of transistors Q5*i* and Q7*i* also go correspondingly high or low. Transistor Q5*i* draws it collector current from the emitter and base of transistors Q3*j* and Q10*j*, respectively, and transistor Q7*i* draws its collector current from the emitter and base of transistors Q5*j* and Q11*j*, respectively.

Thus, in response to an input signal applied to the *i* portion of the circuit there is produced at the emitters of transistors Q3*i* and Q5*i* two output signals in phase with the input signal. Concurrently; the collector currents drawn by transistors Q5*i* and Q7*i* aid in producing two output signals at the emitters of transistors Q3*j* and Q5*j* which are 180° out-of-phase with the input signal to the *i* portion of the circuit.

The detailed operation of the circuit may perhaps best be explained by the following specific example. Assume that the A signal goes "high" (11 volts) and the B signal goes low (7 volts). In response to these signals, the voltages at the emitters of transistors Q3*a* and Q5*a* (in phase with the A signal) increase, thereby turning "on" transistors Q10*a* and Q11*a*, and the voltages at the emitters of transistors Q3*b* and Q5*b* (out-of-phase with the A signal) decrease, thereby cutting "off" transistors Q10*b* and Q11*b*.

In response to the A signal going "high" the collector currents of transistors Q5*a* and Q7*a* increase. Transistor Q5*a* draws an increased collector current from the emitter and base of transistors Q3*b* and Q10*b*, respectively, and thereby quickly discharges the emitter of transistor Q3*b* to one diode drop below the "low" level. Similarly, transistor Q7*a* draws an increased collector current from the emitter of transistor Q5*b* which quickly discharges the potential at the emitter of transistor Q5*b* to 5 $V_{BE}$ drops below the "low" level. This cuts off transistor Q11*b*. Concurrently, in response to the B signal going "low," the collector circuit of transistor Q5*b* and Q7*b* are decreased which enables a greater portion of the increased emitter currents of transistors Q3*a* and Q5*a* to flow into the bases of current switch transistors Q10*a* and Q11*a*.

In response to B going "low" the voltage levels associated with the base and emitters of transistors Q3*b* and Q5*b* have decreased but it is important to note that their current levels have not changed drastically. In some instances the current produced by transistor Q3*b* may even increase to supply the increased collector current of transistor Q5*a*.

It should also be noted that transistors Q3*a*, Q3*b*, Q5*a* and Q5*b* are always conducting regardless of whether a "low" or "high" input signal is present. Maintaining these transistors in a conducting state for all input signal conditions results in high speed of operation. For, when A goes high and B low, there is very little delay associated with transistors Q3*a* and Q5*a* and there is little delay associated with transistors Q3*b* and Q5*b*. Transistors Q3*a* and Q5*a* are not taken from a cut off region to a conducting state and transistors Q3*b* and Q5*b* are not taken from conduction to cut off. That is, each transistor is taken from a first conducting state to a second conducting state. This circuit thus makes use of linear circuit techniques to produce a high speed digital circuit.

In a similar but complementary fashion to the operation just described, when the B signal goes high (A goes low) the emitter currents produced by transistors Q3*b* and Q5*b* turn on transistors Q10*b* and Q11*b*, causing current flow in the opposite direction (than when A is high) through the load. At the same time, the collector currents drawn by transistors Q5*b* and Q7*b* ensure the quick cut off of transistors Q10*a* and Q11*a*, respectively.

It should also be appreciated that each one of transistors Q3*a*, Q3*b*, Q5*a*, and Q5*b* has connected at its emitter a current source whose conduction level changes in the opposite direction to the direction of the signal applied to the base of the transistor to which it is connected. For example, when B goes high (A goes low) the conduction of transistors Q5*b* and Q7*b* increases in response to the B signal and they quickly discharge and lower the potential present at the emitter circuits of transistors Q3*a* and Q5*a*, respectively, whose base potentials have decreased. This feature aids the quick response of the driver circuit and avoids the problem detailed below. When an emitter follower or a transistor having an emitter impedance is switched from "high" to "low" its base may be driven to a potential below that present at the emitter. When the emitter follower transistor is cut off the output impedance at its emitter is no longer low and its emitter voltage decays slowly. For example, immediately after A goes low (7 volts) the base of transistor Q3*a* is decreased to 7 volts but, its emitter potential may still be relatively high (10.2 volts). The potential at the emitter of transistor Q3*a* would then normally decrease relatively slowly since the distributed capacitance present at the emitter would be charged to the relatively high potential and would discharge slowly through the impedance present in the emitter circuit. This problem is solved in circuits embodying the inveniton by the connection of the conduction paths (collector-to-emitter) of transistors Q5*a* and Q5*b* to the emitters of transistors Q3*b* and Q3*a*, respectively, and by the connection of the conduction paths (collector-to-emitter) of transistors Q7*a* and Q7*b* to the emitters of transistors Q5*b* and Q5*a*, respectively. Thus, when the base voltage of transistors Q3*a*, Q3*b*, Q5*a* or Q5*b* goes low, its emitter is quickly discharged by the increased current drawn by the conduction path connected to that emitter.

In FIG. 2 there is shown the current switch described above and a driver circuit having input terminals 1*a* and 1*b* to which are applied complementary input signals A and B ($\bar{A}$) from signal sources 2*a* and 2*b*, respectively. The signal sources may be independent signal sources or may represent the complementary outputs of a gate circuit of the type shown in FIG. 1 or any other suitable gate. In the driver circuit of FIG. 2 the base of each current switch transistors Q10*a*, Q10*b*, Q11*a*, Q11*b*, is connected to a different one of the four outputs of the driver circuit. As in FIG. 1 the driver circuit has two symmetrical portions denoted by subscripts *a* and *b*, and four outputs which are paired. Transistors Q31*a* and Q51*a* produce at their emitters two in phase signals which are out-of-phase with the two output signals produced at the emitters of transistors Q31*b*, Q51*b*.

Transistors Q3*a*, Q31*a*, Q3*b*, Q31*b*, are operated as emitter followers and are connected at their collectors to $+V_{cc}$. Transistor Q3*a* is connected at its base to terminal 1*a* and at its emitter to: 1) the base of transistors Q31*a*; 2) the collector of transistor Q5*b*; and 3) one end of resistor R20*a*. Transistor Q5*a* is connected at its base to the junction of resistors R20*a* and R21*a*. Resistors 20*a* and 21*a* are connected in series between the emitter of transistor Q3*a* and terminal 12. They form a voltage divider and level shift network for supplying a signal to the base of transistor Q5*a* which is in phase with, but of lower amplitude and having a different level than, the voltage present at the emitter of transistor Q3*a*. Transistor Q31*a* is connected at its emitter to the collector of transistor Q51*b* and the base of transistor Q10*a*.

Transistor Q51*a* is connected at its base to the emitter of transistor Q5*a* and at its emitter to the base of transistor Q11*a*. Resistors R22*a*, R23*a*, R22*b* and R23*b* are connected between ground and the emitters of transistors Q5*a*, Q51*a*, Q5*b* and Q51*b*, respectively.

The *b* portion of the driver circuit is symmetrical to the *a* portion and the description of the *b* portion is identical to that for the *a* portion, above, if *a* and *b* subscripts are interchanged. Accordingly, the description of the *b* portion is not detailed.

The operation of the circuit and some of its features may best be appreciated by examining the response of the circuit to various signal conditions. For ease of explanation assume the following: 1) $V_{cc}$ is 11 volts; 2) the high or logic "1" input signal is +11 volts and the low or logic "0" input signal is +7 volts; 3) each $V_{BE}$ drop is approximately 0.80 volts; 4) the load impedance is 2 ohms; and 5) the current source 22 produces a current of 750 milliamperes.

In response to a high (11 volt) signal at A and a low (7 volt) signal at $\bar{A}$, the voltages at the emitters of transistors Q3*a* and Q31*a* are 10.2 volts and 9.4 volts, respectively and the voltages at the emitters of transistors Q3*b* and Q31*b* are at 6.2 volts and 5.4 volts, respectively. Assume that the ratio of resistors R20*a* to R21*a* is substantially equal to that of resistors R20*b* to R21*b*. Assume also that the ratio is selected so that the voltage at the base of transistor Q5*a* or Q5*b* is approximately a factor of 0.6 times the voltage at the emitter of transistors Q3*a* and Q3*b*, respectively. Accordingly, for 10.2 volts at the emitter of transistor Q3*a* the voltage applied to the base of transistor Q5*a* is approximately 6 volts and for 6.2 volts present at the emitter of transistor Q3*b* the voltage at the base of transistor Q5*b* is approximately 3.7 volts.

In response to 6 volts at the base of transistor Q5*a* the voltage at the emitters of transistors Q5*a* and Q51*a* are at 5.2 volts and 4.4 volts, respectively. The 4.4 volts at the emitter of transistors Q51*a* is applied to the base of transistor Q11*a*. In response to a voltage of 6.2 volts at the emitter of transistor Q3*b*, the voltage at the base of transistor Q5*b* is of 3.7 volts. The 3.7 volts present at the base of transistor Q5*b* results in a voltage of 2.9 volts at the emitter of transistor Q5*b* and a voltage of 2.1 volts at the emitter of transistor Q51*b* which is applied to the base of transistor Q11*b*.

Thus, for the condition of A high and $\bar{A}$ low the bases of transistors Q10*a* and Q11*a* are at 9.4 volts and 4.4 volts, respectively, and they are on, and the bases of transistors Q10*b* and Q11*b* are at 5.4 volts and 2.1 volts, respectively, and they are cut off. The cut off of transistors Q10*b* and Q11*b* is demonstrated as follows. The base of transistor Q10*a* is at 9.4 volts and its emitter is at 8.6 volts. With a current of 750 milliamperes flowing through the 2 ohm load the voltage at the emitter of transistor Q10*b* is 7.1 volts. Since the base voltage of transistor Q9 is 5.4 volts, transistor Q10*b* is reverse biased and completely cut off. The emitter voltage of transistors Q11*a* and Q11*b* is at approximately 3.2 volts in response to the 4.4 volts at the base of transistor Q11*a*. Since the voltage applied to the base of transistor Q11*b* is 2.1 volts transistor Q11*b* is reverse biased and is cut off.

Transistors Q10*a*, Q10*b*, Q11*a* and Q11*b* are operated as switches with one pair of switches (e.g. Q10*b*, Q11*b*) turned off when the other pair (e.g., Q10*a*, Q11*a*) is turned on. The "on" transistors though supplying a large current to the load are kept out of saturation, by maintaining their collector voltage substantially above their base voltages. That is, the base voltage of transistor Q10*a* is 9.4 volts while its collector voltage is at 11 volts and the base voltage of transistor Q11*a* is 4.4 volts while its collector voltage is 7.1 volts.

The transistors in the driving circuit are never cut off. They are operated in either a "high" conducting condition or a "low" conducting condition. This feature minimizes turn-on and turn-off delays and results in a high speed of operation.

For the example above, though transistors Q10*b* and Q11*b* are positively and completely cut off, the *b* section transistors driving the bases of these transistors, (i.e., transistors Q3*b*, Q31*b*, Q5*b* and Q51*b*) are not cut off. In response to $\overline{A}$ low, the potential at the emitters of these transistors is at a lower level and these transistors conduct a lower level of current. That the *b* section transistors are "on" may be demonstrated as follows. Transistors Q5*b* and Q51*b* with their bases at 3.7 volts and 2.9 volts, respectively, are foward biased. They are in their "low" conducting state supplying current only to the resistors in their emitter circuits. Transistors Q3*b* and Q31*b* connected at their emitters to the collectors of transistors Q5*a* and Q51*a*, respectively, supply sufficient current to maintain the latter in their "high" conducting state. Thus, the voltage at the emitters of transistors Q3*b* and Q31*b* is sufficiently low so as not to turn on its associated switching transistor Q10*b* but is sufficiently high to supply collector current to transistors Q5*a* and Q51*a*, which the latter use to drive switching transistor Q11*a*.

When transistor Q31*a* is in its high conducting state it provides a current into the base of transistor Q10*a* which may be on the order of 10 to 30 ma and also provides a current into the collector of transistor Q51*b* which may be in the order of 5 to 10 ma. When transistor Q31*a* is in its low conducting state it supplies 10 to 30 ma of current to the collector of transistor Q5*b* which drives switching transistor Q11*b*.

It should, therefore, be appreciated that the current levels in the driving transistors Q3*a* and Q3*b* do not change drastically between the "high" and "low" conduction levels. What the circuit does is to alter the conduction paths in which these currents flow. Thus, the circuit is capable of a high frequency response more typical of linear circuitry than digital circuitry.

Transistors Q5*a* and Q51*a* also serve to eliminate a problem discussed above, which is present when emitter followers are switched. These transistors discharge the capacitances present at the emitters of transistors Q3*b* and Q31*b* and the capacitances associated with the base of transistor Q10*b*. For example, immediately after A goes "high" and $\overline{A}$ goes low, the potential at the emitters of transistors Q3*b* and Q31*b* may be higher than their base potential due to the storage of charge across the capacitance at their emitters. In the absence of transistors Q5*a* and Q51*a*, transistors Q3*b* and Q31*b* could be cut off and the response of the system would be slowed since the potential at their emitters would remain high (discharging slowly through the emitter resistance or through leakage). However, the potential at the emitters of transistors Q3*b* and Q31*b* and the base of transistor Q10*b* is quickly decreased to the "low" level due to the actions of transistors Q5*a* and Q51*a* which are in their high conduction state.

Therefore, in circuits embodying the invention emitter follower transistors are connected at their emitters to the collectors of transistors whose conduction is controlled by signals which are the complement of those applied to the emitter followers. The conduction in each of the transistors in the driver circuit is increased or decreased depending on the input signal condition but is never cut off. The operation of the circuit has been described for A high and $\overline{A}$ low but it is evident that the circuit will operate in a complementary manner for $\overline{A}$ high and A low. That is, transistors Q3*b*, Q31*b*, Q5*b* and Q51*b* assume the states and conditions of transistors Q3*a*, Q31*a*, Q5*a* and Q51*a*, respectively, described above.

The circuits have been illustrated using NPN bipolar transistors. PNP bipolar transistors could be used instead with due care for the polarity of the power supply. It should also be appreciated that although the circuit has been illustrated using bipolar transistors that field effect transistors of either the P-type or N-type could also be used to practice the invention.

The operation of the circuit has been given for $V_{cc}$ at 11 volts and with the most negative potential being ground. This is by way of example only and $V_{cc}$ could, for example, be more or less than 11 volts and the lowest potential could correspondingly be either more positive or more negative than ground.

What is claimed is:

1. A circuit for concurrently producing two in-phase signals and two out-of-phase signals comprising:

- first and second input terminals adapted to receive a binary input signal and its complement, respectively;
- first, second, third and fourth output terminals;
- first means coupled between said first input terminal and said first output terminal; second means coupled between said second input terminal and said second output terminal; said first and second means for producing at their respective output terminals a signal in-phase with the signals applied at their respective input terminals;
- third and fourth means, each of said third and fourth means having a conduction path and a control electrode for controlling the conductivity of said path;
- first coupling means coupled between said first input terminal and the control electrode of said fourth means for coupling to the latter the signal received at said first input terminal; second coupling means coupled between said second input terminal and the control electrode of said third means for coupling to the latter the signal received at said second input terminal;
- means connecting one end of the conduction path of said third means to said first output terminal and the other end of that conduction path to said third output terminal for providing a path for current to flow through said first and third means when said third means is enabled; and
- means connecting one end of the conduction path of said fourth means to said second output terminal and the other end of that conduction path to said fourth output terminal for providing a path for current to flow through said second and fourth means when said fourth means is enabled.

2. The circuit as claimed in claim 1, wherein each one of said means includes a transistor having a control electrode and first and second electrodes defining the ends of a conduction path and wherein each one of said first and second means includes a transistor connected in the voltage follower configuration, each voltage follower transistor being connected at its control electrode to an input terminal, at its first electrode to an output terminal, and at its second electrode to a point of fixed potential;

wherein said third means includes a transistor direct current connected at its first electrode to said third output terminal and at its second electrode to said first output terminal and being coupled at its control electrode through said second coupling means to said second input terminal; and wherein said fourth means includes a transistor direct current connected at its first electrode to said fourth output terminal and at its second electrode to said second output terminal and being coupled at its control electrode through said first coupling means to said first input terminal.

3. The circuit as claimed in claim 2, wherein each one of said transistors is a bipolar transistor having a base, an emitter and a collector and wherein said base is said control electrode, said emitter is said first electrode and said collector is said second electrode; and wherein said first and second coupling means include level shift means.

4. The circuit as claimed in claim 3 further including a bridge circuit having first, second, third and fourth controllable conduction paths, each one of said controllable paths having a control electrode for controlling the conductivity of said path; each one of said control electrodes associated with a numbered path being connected to the correspondingly numbered one of said output terminals; the conduction of each of said controllable paths being controlled by the signal applied to its control electrode.

5. The circuit as claimed in claim 4, wherein said first and third paths of said bridge circuit are connected in series between two nodes and wherein said second and fourth paths of said bridge circuit are connected in series between said two nodes;

further including a current source connected between said two nodes; and further including a load connected between the junction of said first and third paths and the junction of said second and fourth paths.

6. The circuit as claimed in claim 1, wherein each one of said first and second means includes two transistors connected in the emitter follower configuration, the first of said two transistors being connected at its base to an input terminal, at its emitter to the base of the second transistor, and the second transistor being connected at its emitter to an output terminal;

wherein each one of said third and fourth means includes two transistors;

wherein the first and second transistors of said first means are connected at their emitters to the collectors of the first and second transistors, respectively, of said third means; and wherein the first and second transistors of said second means are connected at their emitters to the collectors of the first and second transistors, respectively, of said fourth means.

7. The circuit as claimed in claim 1, further including fifth and sixth means, each one of said fifth and sixth means having a conduction path and a control electrode for controlling the conductivity of said conduction path;

means coupling the control electrode of said fifth means to said first input terminal for applying to that control electrode the signal received at said first input terminal;

means coupling the control electrode of said sixth means to said input terminal for applying to that control electrode the signal received at said second input terminal;

means coupling the conduction path of said fifth means between said third output terminal and a point of fixed potential for conducting current through the conduction path of said fifth means between said third output terminal and said point of potential when said fifth means is enabled; and means coupling the conduction path of said sixth means between said fourth output terminal and said point of fixed potential for conducting current through the conduction path of said sixth means between said fourth output terminal and said point of potential, when said sixth means is enabled.

8. The circuit as claimed in claim 7 wherein said fifth and sixth means each include a transistor;

wherein said transistor of said fifth means is connected at its collector to said third output terminal, at its emitter to said point of fixed potential and is coupled at its base to said first input terminal; and wherein said transistor of said sixth means is connected at its collector to said fourth output terminal, at its emitter to said point of fixed potential and is coupled at its base to said second input terminal.

9. The combination comprising:

two pairs of two transistors, each transistor having a control electrode and first and second electrodes defining the ends of a conduction path; each pair including a first transistor connected at its first electrode to the second electrode of the second transistor of the pair for providing a current path for the conduction path of the latter;

first and second terminals for the application thereto of a signal and its complement, respectively;

four output terminals;

means connecting each transistor at its first electrode to a different one of said four output terminals;

means coupling the control electrode of the first transistor of one pair to said first terminal and first level shift means coupling the control electrode of the second transistor of the other pair to said first terminal for producing at the first electrodes of the first transistor of one pair and the second transistor of said other pair a signal in phase with that applied at said first terminal; and means coupling the control electrode of the first transistor of the other pair to said second terminal and second level shift means coupling the control electrode of the second transistor of said one pair to said second terminal for producing at the first electrodes of the first transistor of the other pair and the second transistor of said one pair a signal in phase with the signal applied at said second terminal.

10. The combination as claimed in claim 9, wherein each one of said transistors is a bipolar transistor having a base, an emitter and a collector electrode, and wherein said base electrode is said control electrode, said emitter electrode is said first electrode and said collector electrode is said second electrode.

11. In combination with a bridge network having four controllable paths, each controllable path having a conduction path and a control electrode for controlling the conduction of the path, first and second ones of said controllable paths being connected between a common first terminal and second and third terminals, respectively, and third and fourth ones of said paths being connected between a common fourth terminal and said second and third terminals, respectively, a driving circuit comprising:

first and second input points adapted to receive a first signal and its complement, respectively;

first means coupled between said first input point and the control electrode of said first controllable path for providing a switch-on current to said first controllable path in response to a turn-on signal at said first input point;

second means coupled between said second input point and the control electrode of said second controllable path for providing a switch-on current to said second controllable path in response to a turn-on signal at said second input point;

third and fourth means, each having a conduction path and a control electrode;

means coupling the control electrode of said third means to said first input point;

means connecting the conduction path of said third means between the control electrodes of said second and fourth controllable bridge paths for providing a switch-on current to said fourth controllable path which flows in said second means and flows in a direction to turn on said fourth controllable path and turn off said second controllable path in response to a turn-on signal at said first input point;

means coupling the control electrode of said fourth means to said second input point; and means connecting the conduction path of said fourth means between the control electrodes of said first and third controllable bridge paths for providing a switch-on current to said third controllable path which flows in said first means and flows in a direction to turn on said third controllable path and turn off said first controllable path in response to a turn-on signal at said second input point.

12. A circuit for concurrently producing two in-phase signals and two out-of-phase signals comprising:

first and second input terminals adapted to receive a binary input signal and its complement, respectively;

first (Q3*a*), second (Q3*b*), third (Q5*b*) and fourth (Q5*a*) transistors, each transistor having a base, an emitter and a collector;

means connecting the base of said first transistor (Q3*a*) to said first input terminal (A) and means connecting the base of said second transistor (Q3*b*) to said second input terminal (B);

means connecting the collector of said third transistor (Q5*b*) and means connecting the base of said fourth transistor (Q5*a*) to the emitter of said first transistor;

means connecting the collector of said fourth transistor (Q5*a*) and means connecting the base of said third transistor (Q5*b*) to the emitter of said second transistor (Q3*b*); and output means connected to the emitters of said transistors for deriving signals from the emitters of said first and fourth transistors which are in-phase with each other and out-of-phase with the signals derived from the emitters of said second and third transistors.

13. The combination as claimed in claim 12 further including fifth and sixth transistors, each transistor having a base, an emitter and a collector;

means connecting the collector of said fifth transistor (Q7*a*) and the base of said sixth transistor (Q7*b*) to the emitter of said third transistor (Q5*b*); and means connecting the collector of said sixth transistor (Q7*b*) and means connecting the base of said fifth transistor (Q7*a*) to the emitter of said fourth transistor.

14. The combination as claimed in claim 12 wherein said output means includes, first, second, third and fourth output terminals; and further includes:

a fifth transistor (Q31*a*) having its base-to-emitter path connected between the emitter of said first transistor (Q3*a*) and said first output terminal; a sixth transistor (Q31*b*) having its base-to-emitter connected between the emitter of said second transistor (Q3*b*) and said second output terminal, a seventh transistor (Q51*b*) having its base-to-emitter path connected between the emitter of said third transistor (Q5*b*) and said third output terminal and an eighth transistor (Q51*a*) having its base-to-emitter connected between the emitter of said fourth transistor (Q5*a*) and said fourth output terminal; and further including means for connecting the collector of said seventh transistor (Q51*b*) to the emitter of said fifth transistor (Q31*a*) and the collector of said eighth transistor (Q51*a*) to the emitter of said sixth transistor (Q31*b*).

* * * * *

UNITED STATES PATENT OFFICE

CERTIFICATE OF CORRECTION

Patent No. 3,828,206    Dated August 6, 1974

Inventor(s) Borys Zuk

It is certified that error appears in the above-identified patent and that said Letters Patent are hereby corrected as shown below:

Column 2, line 15    "$\overline{B} = A$" should be -- $B = \overline{A}$ ---

Column 5, line 16    "inveniton" should be --- invention---

Signed and sealed this 21st day of January 1975.

(SEAL)
Attest:

McCOY M. GIBSON JR.
Attesting Officer

C. MARSHALL DANN
Commissioner of Patents